United States Patent
Setayesh et al.

(10) Patent No.: US 7,750,339 B2
(45) Date of Patent: Jul. 6, 2010

(54) ELECTRONIC DEVICE INCLUDING A FIELD EFFECT TRANSISTOR HAVING AN ORGANIC SEMICONDUCTOR CHANNEL

(75) Inventors: Sepas Setayesh, Eindhoven (NL); Dagobert Michel De Leeuw, Eindhoven (NL); Michael Buechel, Eindhoven (NL); Thomas Dimitriou Anthopoulos, Eindhoven (NL); Wilhelmus Peter Martinus Nijssen, Eindhoven (NL); Eduard Johannes Meijer, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 631 days.

(21) Appl. No.: 10/543,276

(22) PCT Filed: Jan. 27, 2004

(86) PCT No.: PCT/IB2004/050055
§ 371 (c)(1), (2), (4) Date: Jul. 25, 2005

(87) PCT Pub. No.: WO2004/068609
PCT Pub. Date: Aug. 12, 2004

(65) Prior Publication Data
US 2006/0163561 A1   Jul. 27, 2006

(30) Foreign Application Priority Data
Jan. 28, 2003  (EP) .................... 03100177

(51) Int. Cl.
H01L 35/24 (2006.01)
H01L 51/00 (2006.01)
H01L 27/01 (2006.01)
H01L 27/12 (2006.01)
H01L 31/0392 (2006.01)

(52) U.S. Cl. ........................ 257/40; 257/347
(58) Field of Classification Search ............... 257/40, 257/347, E27.112, E29.147
See application file for complete search history.

(56) References Cited

U.S. PATENT DOCUMENTS

| | | | |
|---|---|---|---|
| 5,380,807 A | 1/1995 | Havinga et al. | |
| 6,621,003 B2 * | 9/2003 | Yoshida et al. | 428/432 |
| 6,794,220 B2 * | 9/2004 | Hirai et al. | 438/99 |

* cited by examiner

Primary Examiner—Cuong Q Nguyen
(74) Attorney, Agent, or Firm—Leydig, Voit & Mayer Ltd.

(57) ABSTRACT

Provided is a filed-effect transistor with an organic semiconductor material showing ambipolar behaviour. Thereto, the organic semiconductor material enabling the ambipolar behaviour is a material with a small band gap.

8 Claims, 8 Drawing Sheets

SQ1

SQ2

SQ3

TPDNi

PCBM

ELECTRONIC DEVICE INCLUDING A FIELD EFFECT TRANSISTOR HAVING AN ORGANIC SEMICONDUCTOR CHANNEL

The invention relates to an electronic device comprising a field-effect transistor provided with a source and a drain electrode that are mutually connected by a channel comprising an organic semiconductor material, and a gate electrode that is separated from the channel through a dielectric layer.

The invention also relates to a method of manufacturing such a device.

Such a device is known from WO03/030278. This device is a typical example of devices in the field of organic electronics. It comprises a field-effect transistor as the semiconductor element. The organic semiconductor material is herein a p-type material, which implies that carrier transport between the source and drain electrodes functions through holes.

This type of organic semiconductor device has been shown to function and is being industrialized. In addition thereto, discrete n-type transistors have been reported. Discrete p-channel and n-channel transistors have been combined into complimentary logic gates, such as inverters, and ring oscillators (A. Dodabalapur et. al, Appl. Phys. Lett. 69 (1996) 4227). Logic functionality has been demonstrated with 48-stage shift registers. (B. Crone, A. Dodabalapur, Y. Y. Lin, R. W. Filas, Z. Bao, A. LaDuca, R Sarpeshkar, H. E. Katz and W. Li, Nature (London) 403 (2000) 521. The problem however is that two different semiconductors had been used, one for the p-channel and one for the n-channel. Both materials have to be deposited and patterned locally and sequentially. We know from hard experience that fabrication of organic unipolar PMOS circuits already is difficult. Minimizing the parameter spread, not to mention the matching of the n- and p-channel transconductances, when using two different semiconductors is not a realistic target. A breakthrough for the development of complimentary logic will be the realization of discrete ambipolar transistors. Such a device has been reported by Schoen et al. (Science 287 (2000) 1022). Single crystals of pentacene were used with gold electrodes and aluminum oxide as a gate dielectric. The paper, however, is retracted, in view of the Report of the investigation committee on the possibility of scientific misconduct in the work of Hendrik Schon and coauthors, 2002. It is therefore desired to find organic semiconductors that allow a complementary logic, such as commonly practiced in CMOS designs.

It is thus an object of the invention to provide a device of the kind mentioned in the opening paragraph, which is more broadly and more versatilely applicable than the known devices that operate with either a p-type or an n-type organic semiconductor material.

This object is achieved in accordance with the invention, in that the organic semiconductor material is a material with a small band gap and that the source and drain electrode comprise the same material. The result of the small band gap material as semiconductor is that the transistor shows ambipolar behaviour. The expression 'small band gap' must be understood, in the context of this application, as a material in which both holes and electrons can be injected, in particularly in combination with electrodes of one and the same material. Theoretically, the band gap is defined as the energy difference between the top of the highest occupied molecular orbital (HOMO) and the bottom of the lowest unoccupied molecular orbital (LUMO). In the ambipolar transistor, electrons are injected in, the LUMO and holes in the HOMO. To enable such injection, the injection barriers may not be too high. Therefore, the workfunction of the electrodes is preferably within the band gap. As will be explained later on, this workfunction can be obtained with the choice of a suitable material, but also by the provision of specific surface layers with which the workfunction can be tuned.

The important advantage of this invention, is that such ambipolar behaviour is achievable with a single material, that can be chosen so as to be solution processable. Furthermore, it is possible to use as basic material for the electrodes one and the same material. It is thus not needed to use both silver or gold, or to apply one electrode of Ba or Ca, as is done in light emitting diodes. Moreover, it is thus not necessary to define separate n-type transistors and p-type transistors, that have a different or the same organic semiconductor material, but different electrode materials. This is a large advantage for simplified processing and integration.

Particularly, the small band gap is a band gap of less than 1.8 eV, and more preferably 1.5 eV. A plurality of structurally different compounds can be derived thereof, such as for instance squaraines, croconaines, tetrathiocomplexes, phtalocyanines, oligoarylenes and polymers thereof and polyvinylfluorenes. The synthesis of such materials is known per se. An example of such synthesis method is found in U.S. Pat. No. 5,380,807, that discloses the synthesis of alternating copolymers. That patent however, discloses the use of these class of materials as conducting materials solely. This is particularly clear from the passage in column 4, wherein it is stated that the conductivity might be increased by doping. However, in the present application the semiconductor material is part of the channel and doping is completely undesired. This would lead to parasitic leakage currents between the first and second electrode, and hence to complete malfunctioning of the transistor.

In a preferred embodiment, the small band gap materials have a structure comprising a conjugated middle part in between of end groups, said middle part and at least one of said end groups acting as a pair of an electron acceptor and an electron donor. The middle group is herein particularly a four or five membered ring provided with for instance carboxylgroups. Preferred band gap materials are various types of squaraines and croconaines. These materials comprise a four- or five membered rings respectively as the middle part and aromatic or conjugated (hetero)cyclic groups as the end groups. The conjugation herein extends from the middle part to the end groups. The end groups are usually provided with side groups. Suitable side groups are for instances alkyls, and alkoxy, including tert-butyls, isopropyls and n-alkyls. Also precursor types of compounds can be applied. The materials may be symmetric, but there is no need therefore.

In a second embodiment, the small band gap materials are multiring systems, wherein the rings are coupled through a metal ion or atoms, such as Ni, Pt or the like, and form conjugated systems. The conjugated multiringsystems can be chosen from a variety of groups. Hetero-atoms are preferred to establish interaction with the metal, and hence have a stable complex. A preferred example is a tetrathiocomplex. Side groups may be present to optimize stability and processability. The materials may be symmetric, but there is no need therefore.

In a third embodiment, the small band gap materials are chosen from the group of (poly)indenofluorenes. The synthesis of these compounds is known per se from Synt. Met 101 (1999), 128-129.

In a very suitable elaboration, the organic semiconductor material is part of an electrically insulating organic polymer structure. Such a polymer structure is known from WO-A 03/9400. The organic semiconductor material can be embedded in such a structure as side groups in a polyvinylic polymer, as one of the monomers to come to a copolymer, particularly a block copolymer and within a polymer network, for instance in that use is made of acrylates as the network building polymer. It is noted that the insulating structure can be chosen such that the system can be processed from solution in an excellent manner. Furthermore, the matrix material of the structure offers the possibility to optimize the desired processing and electrical behaviour.

Alternatively or additionally, the semiconductor material may be provided with an additional separate carrier material. Such a carrier material improves the processing of the semiconductor material from solution, e.g. with spin coating, printing, web coating or the like. At the same time, the mobility in the channel is hardly reduced. Examples of suitable carrier materials include polyvinylic compounds, polyimides, polyesters.

In a further embodiment, the channel comprises both an ambipolar small band gap material and an p-type or n-type organic semiconductor material. The p-type or n-type material acts as an additional and parallel connection between source and drain. The resulting mobility can thus be increased. As a consequence, the currents in the p-type transport mode and in the n-type transport mode can be matched, or tuned in any other desired manner.

It is particularly preferred that the first and second electrodes are defined as patterns in an electrode layer. It has been found, that it is not necessary to use different electrode materials to obtain either the n-type or the p-type behaviour. Thus, there is no need to make two elements with the same semiconductor material and with different electrodes. There is neither a need to distinguish the one and the other electrode, such as is usually done in light-emitted diodes and in photovoltaic cells. As the skilled reader will understand, this strongly simplifies the manufacturing of such a device in an integrated manner.

In a further embodiment the electrode materials is chosen to comprise a noble metal. Examples hereof include gold, platina, palladium, silver. The workfunction of such noble metal turns out to fit well to the HOMO and LUMO level of the small band gap materials. However, other materials such as organic conductors including poly-3,4-ethylenedioxythiophene (PEDOT) and oxidic conductors including indiumtinoxide (ITO) are not to be excluded.

In an even further and very advantageous embodiment, a surface dipolar layer is provided between the electrode layer and the channel with the organic semiconductor material. Such a surface dipolar layer can be used to tune the workfunction of the electrode layer. Therewith an optimal fit with the energy levels of a specific organic semiconductor material can be achieved. The variation in the workfunction of the modified electrodes is in the order of 1 eV, which is substantial. The surface dipolar layer can be applied on the complete electrode layer, covering both the source and the drain electrode. Alternatively, it may be applied to one or more transistors, while other transistors are present without monolayer.

The transistor has furthermore by preference a bottom-gate structure. In such a structure, the gate is present on a substrate or part thereof. The dielectric layer and preferably also the source and drain electrodes are provided thereon. The organic semiconductor layer is the top layer of the structure. The bottom-gate structure is advantageous for processing reasons.

The organic semiconductor material of the invention, is preferably patterned, so as to isolate a first transistor from a second transistor and prevent any leakage currents. Such patterning is achieved directly by using printing techniques for the deposition. Alternatively, use is made of photolithography. This can be done, for instance by application of a photoresist material on top of the organic semiconductor material. It is preferable, then, to use a protective layer between the photoresist material and the organic semiconductor material, so as to prevent any contamination of the organic semiconductor material. Such a protective layer may be a black coating, so as to inhibit irradiation. The use of such a protective layer is known per se from the non-prepublished application EP03100574.7 (PHNL030190), that is included herein by reference.

The field-effect transistor is suitably integrated into an inverter structure, in which the ambipolar behaviour can be exploited in a good manner. Moreover such inverter structures can have a common gate-electrode for its first and second transistor. This reduces the parasitic effects, and reduces the resistance due to the absence of any interconnect. Furthermore, the use of a common gate electrode reduces the requirement to lithographic patterning, that may be achieved with photolithography, but also with any kind of printing technique including inkjet printing and microcontact printing.

As a man of skill in the art will understand, materials other than the above-mentioned can be used too. Moreover, it holds that the device can include more elements than just the transistor or the inverter. A number of inverters can for example be connected in series, while forming a ring oscillator. The inverters may also be part of NAND or NOR units. The transistors can be executed with another dimensioning, for example with smaller channel lengths or with larger channel widths.

It is further observed that the field-effect transistor is suitable integrated in an integrated circuit or in a matrix of transistors. Herein, there is no need that the ambipolar behaviour is exploited in all transistors. Particularly, it may well be advantageous to exploit only the p- or the n-type behaviour for certain transistors. The integrated circuit or matrix of transistors, for instance for use in displays, may be provided on a flexible substrate, such that the device as a whole will be flexible.

The second object of the invention is the manufacture of such a device in a suitable manner. This is achieved in that the organic and ambipolar semiconductor material is applied by any wet-chemical deposition techniques. This is enabled by the use of semiconductor materials with a small band gap. Preferably, use is made of a single electrode layer in which both the first and the second electrode, and optionally also further electrodes are integrated. As is explained in the above mentioned text, one of the major advantages of the invention is that the integration into large-scale circuits is enabled and that less different electrode materials are needed. In effect, that implies that the processing is improved substantially.

These and other aspects of the device and the method of the invention will be further elucidated with reference to the figures, in which.

Figure 1:
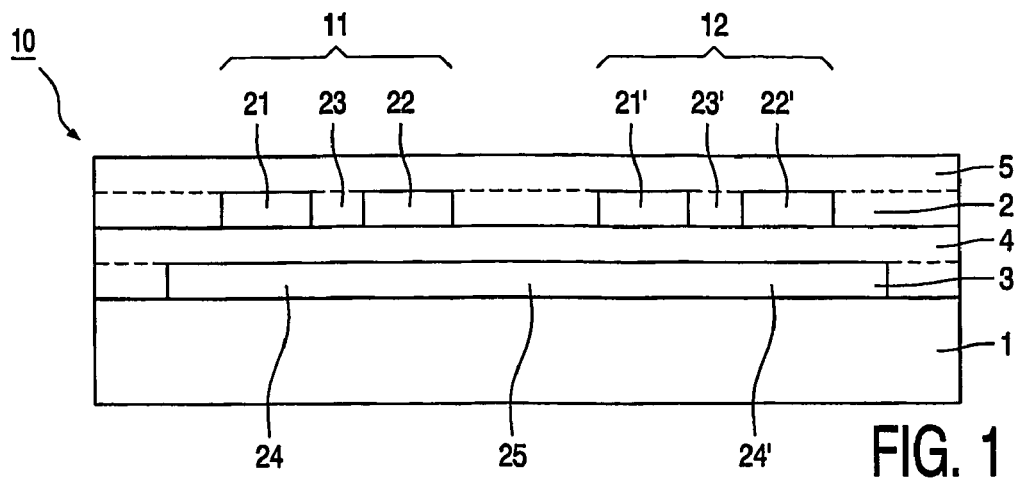
FIG. 1 shows a diagrammatic cross-section of a couple of transistors.

The device 10 shown in FIG. 1 comprises a first field-effect transistor 11 and a second field-effect transistor 12 on an electrically insulating substrate 1. A first electrode layer 2 and a second electrode layer 3 are present on the substrate 1. In the first electrode layer 2 source electrodes 21, 21' and drain electrodes 22, 22' are defined, which electrode pairs 21, 22 and 21', 22' are separated from one another by a channel 23, 23', respectively. In the second electrode layer 3 gate electrodes 24, 24' and an interconnect 25 interconnecting them are defined. In a vertical projection of the gate electrode 24 on the first electrode layer 2 the gate electrode 24 substantially overlaps the channel 23. In addition, an intermediate dielectric layer 4 and an active layer 5 of an organic semiconductor material, according to the invention with a small band gap, are present.

The above-mentioned layers 2,3,4,5 are present in the order of second electrode layer 3, intermediate layer 4, first electrode layer 2 and active layer 5 on the substrate 1. In order to planarize the substrate, an insulating planarization layer—not shown—is present made of, for example, polyvinyl alcohol or a photoresist. The second electrode layer 3 contains Au and is brought into a desired pattern in a known manner with the help of an exposed and developed photo-sensitive resist. The intermediate layer 4 contains in general a photostructurable organic dielectric, such as benzocyclobutene, polyimide, polyvinylphenol or a photoresist, such as SU8. The intermediate layer may also contain an inorganic dielectric, such as for example $SiO_2$, which was the case in a first experiment. In a second experiment the photoresist SU8 was applied as an intermediate layer. The first electrode layer 2 contains gold in this case.

The first electrode layer 2 is covered by the active layer 5 by means of spin coating to a thickness of 50 nm. The active layer 5 contains a material providing ambipolar behaviour. The material is, according to the present invention, a semiconductor material with a small band gap. The active layer is as much as possible free from any ions, as such ions lead to leakage currents.

Figure 2A:
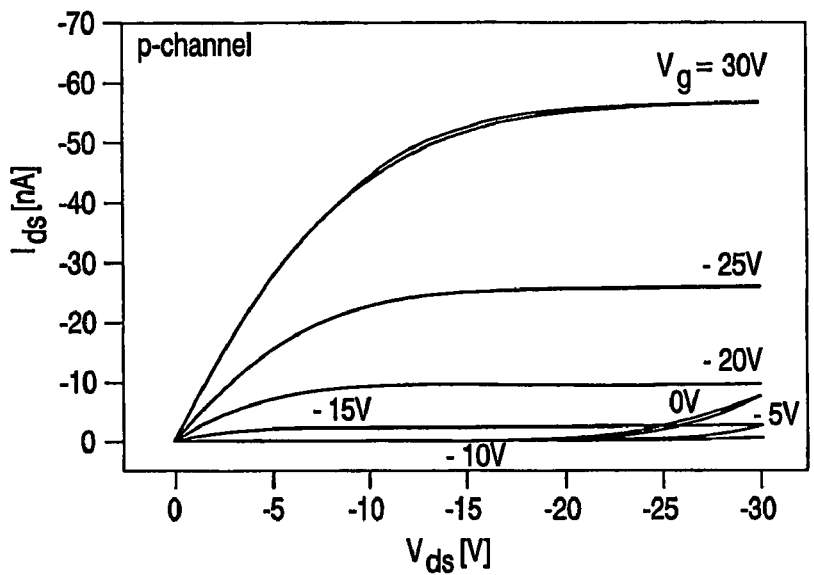
FIG. 2 shows the relationship between the voltage $V_{ds}$ between the source and drain electrode and the resulting current $I_{ds}$ at different voltages $V_g$ on the gate electrode in an ambipolar transistor.
Figure 2B:
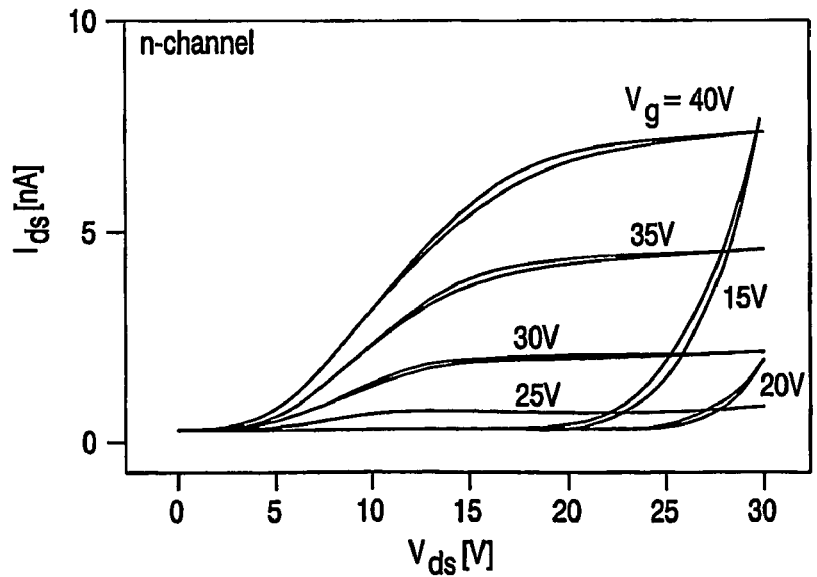
Figure 3:
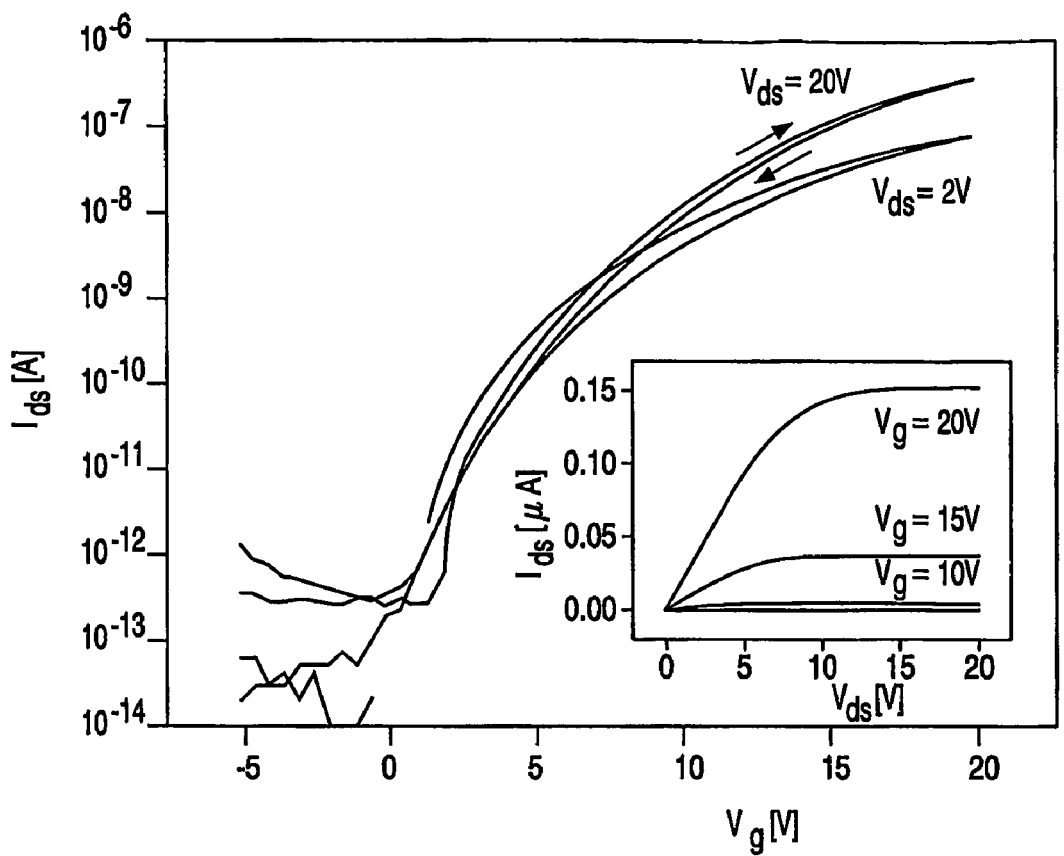
FIG. 3 shows the relationship between the voltage $V_{ds}$ between the source and drain electrode and the resulting current $I_{ds}$ at different voltages $V_g$ on the gate electrode in a unipolar transistor with only an n-type semi-conductor material
Figure 4:
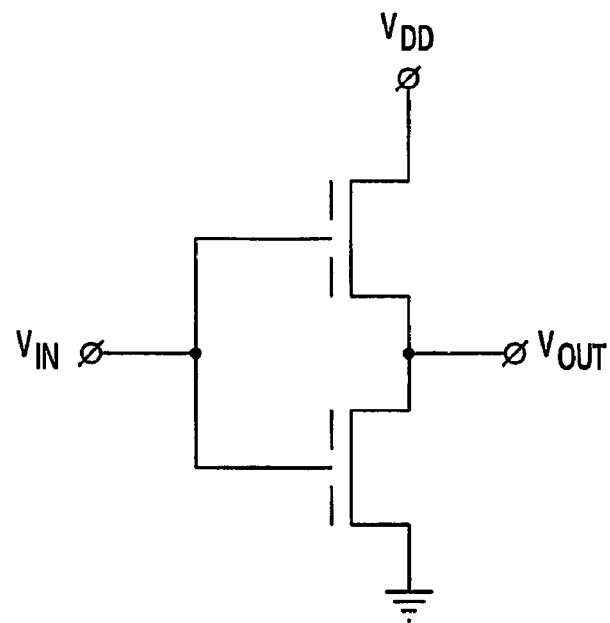
FIG. 4 shows an electrical diagram of an inverter unit.
Figure 5:
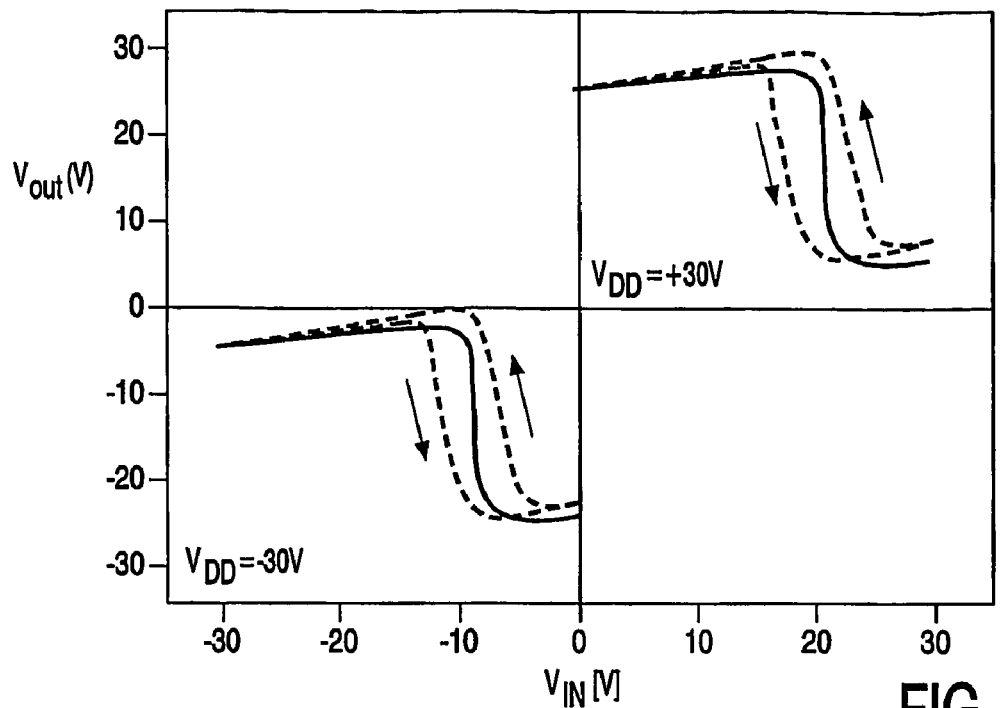
FIG. 5 shows the relationship between the input voltage $V_{IN}$ and the output voltage $V_{OUT}$ of an inverter unit comprising ambipolar transistors.
Figure 6:
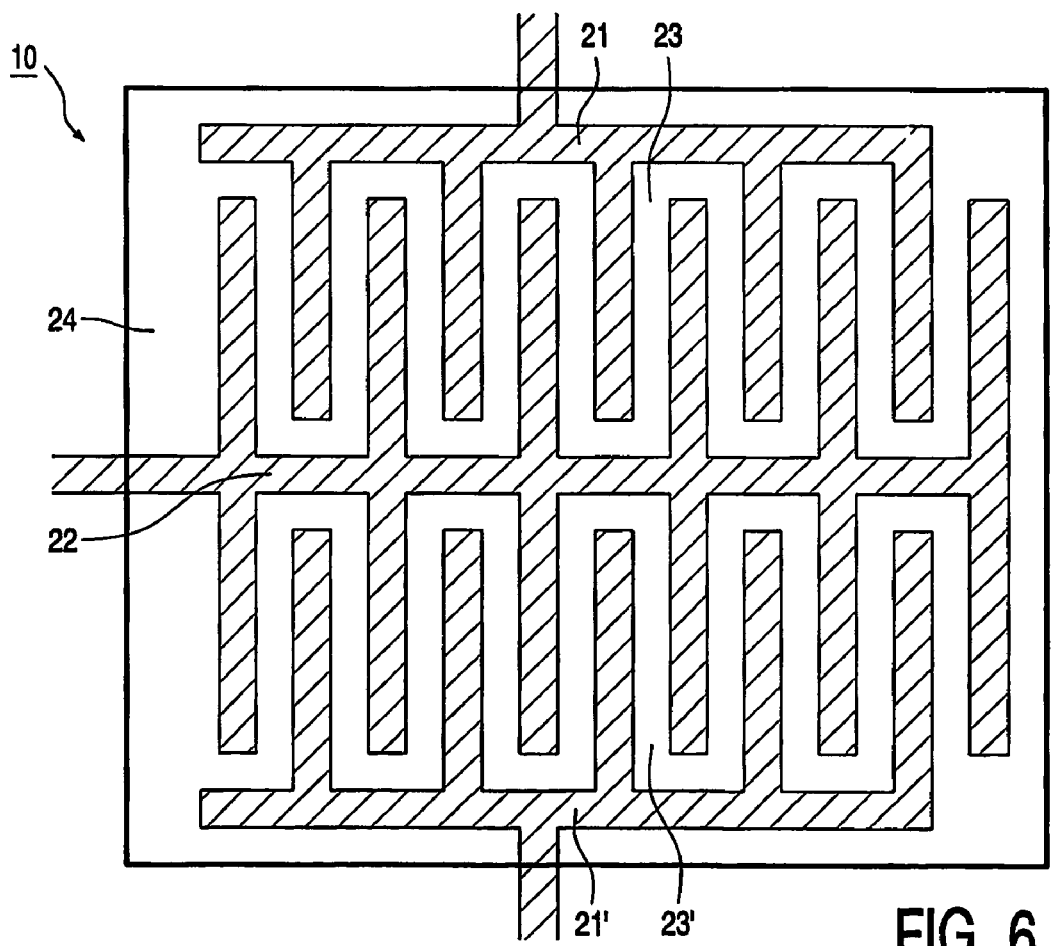
FIG. 6 shows a diagrammatic plan view of an embodiment of an inverter unit.

FIG. 2 and FIG. 3 discuss the principles of an ambipolar transistor as compared to a transistor with a n-type channel. FIGS. 4, 5 and 6 show examples of the application of such an ambipolar transistor into an inverter structure.

FIG. 2 shows the data for a transistor with an active layer of the blend of [6,6]-phenyl C61 butyric acid methylester and $OC_1OC_{10}$-PPV-poly [2-methoxy, 5-(3,7 dimethyl-octyloxy)-p-phenylene vinylene. The ratio in the blend is 4:1. FIG. 3 shows a graph of a comparable transistor, in which [6,6]-phenyl C61 butyric acid methylester is applied as a semiconductor material, that is to say, only the n-type material. The graphs are based on measurements on a typical test device, where the gate electrode 24 is located in a silicon substrate. The surface of the substrate 1 is then oxidized to silicon dioxide, which forms the dielectric layer 4. On this layer are placed the source and drain electrodes 21, 22 of Au. On top of this is found the active layer 5. The channel length was then 40 µm and the channel width 1 mm. The $SiO_2$ layer was treated with a primer, which was hexamethyldisilazane (HMDS).

FIG. 2 shows graphs in which the current $I_{ds}$ is plotted in nA against the voltage between the source and drain electrodes $V_{ds}$ for various gate voltages $V_g$. For high negative voltages $V_g$ on the gate electrode, as shown in FIG. 2(a), the transistor is in the "hole enhancement mode". The characteristics of the transistor are here identical to a unipolar transistor of the semi-conductor material $OC_1OC_{10}$-PPV. At low voltages on the gate and high voltages on the drain $V_{ds}$ the current $I_{ds}$ shows a noticeable rise with the voltage on the drain $V_{ds}$. This is a typical characteristic of the ambipolar transistor and is not present in the comparable unipolar transistor.

At positive voltages $V_g$ on the gate electrode, as shown in FIG. 2(b), the transistor operates in the "electron-enhancement mode", with a mobility of $3.10^{-5}$ cm$^2$/Vs at $V_g$=30 volts. At low voltages on the drain $V_{ds}$ a non-linear increase of the current is noticeable. For low voltages on the gate $V_g$ (for instance 15 V) and high voltages on the drain $V_{ds}$ (for instance 25 V) again a noticeable increase is found in the current, which is typical of the ambipolar transistor. This increase of the current is attributed to the fact that under certain conditions both holes and electrons are present in the transistor, so that a p-n-junction is formed in the channel.

When the transistor is in the "hole accumulation mode" the current can be described with a model based on the hopping of charge carriers in an exponential density of states (DOS), as is known from Phys. Rev. B 57, 12964 (1998). For the description of the n-type conductivity injection-limited current is considered. In the case of an increase of $V_{ds}$ to the point where $V_{ds}$ equals $V_d$-$V_{so}$ (the switch-on voltage), the channel is cut off at the drain electrode. For still greater drain voltages $V_{ds}$ a depletion region around the drain electrode will develop in unipolar transistors and the current will saturate. For an ambipolar transistor, however, the electrons accumulate at the drain electrode in case of a further rise of the drain voltage $V_{ds}$. These two accumulation regions provide for the occurrence of a pn-junction. The current $I_{ds}$ between source and drain can subsequently be calculated, provided that the current at the pn-junction cannot change, and provided that the combined lengths of the electron accumulation region and the hole accumulation region are equal to the channel length. It follows from this that the current $I_{ds}$ consists of the sum of the currents of holes and electrons. The ambipolar transistor can thus physically be considered a p-type and an n-type transistor which are connected in parallel.

The ambipolar transistors are very suitable for integration into inverters. FIG. 4 shows an electrical diagram of an inverter unit based on ambipolar transistors. FIG. 5 shows the transfer characteristics of this inverter unit, in which two transistors with identical active layers are applied. The applied transistors have an active layer with a blend of [6,6]-phenyl C61 butyric acid methylester and of $OC_1OC_{10}$-PPV.

The applied transistors are described with reference to FIG. 2. Depending on the polarity of the supply voltage $V_{DD}$, the inverter operates according to the invention in the first or the third quadrant. An inverter based on unipolar logics, on the other hand, operates only in the first quadrant. Moreover, a small increase in the output voltage $V_{out}$ can be observed at low and at high values of the input voltage $V_{IN}$. This increase is attributed to the fact that both transistors function as a parallel circuit of an n-type and a p-type transistor. Both at a high and at a low input voltage $V_{IN}$ the inverter can, however, still draw some current. This results in the increase of the output voltage $V_{OUT}$ found. The properties of the inverter can be modelled with a density of state (DOS) approach. This leads to the behavior that is shown in the graph in a black line. Moreover, it is remarkable that the graph of $V_{OUT}$ versus $V_{IN}$ has a considerably symmetrical position in the quadrant. This is advantageous in that the trip voltage—the voltage at which the value of the input voltage $V_{IN}$ equals the value of the output voltage $V_{OUT}$—lies midway between the input voltage with a minimum output and the input voltage with a maximum output. As a result, the noise margin is optimal. With unipolar logics, on the other hand, the trip voltage deviates from said middle value, so that a further reduction of the noise margin is achieved.

FIG. 6 shows in plan view an embodiment of the inverter 10 unit as shown in FIG. 4. Here a common gate electrode 24 is applied, and the source and drain electrodes 21,22 are executed in a interdigitated finger-like structure. This leads to a broad channel 23, 23' on a limited surface. The drain electrode 22 is then shared by the source electrode 21 of the first transistor and the source electrode 21' of the second transistor.

Figure 7A:
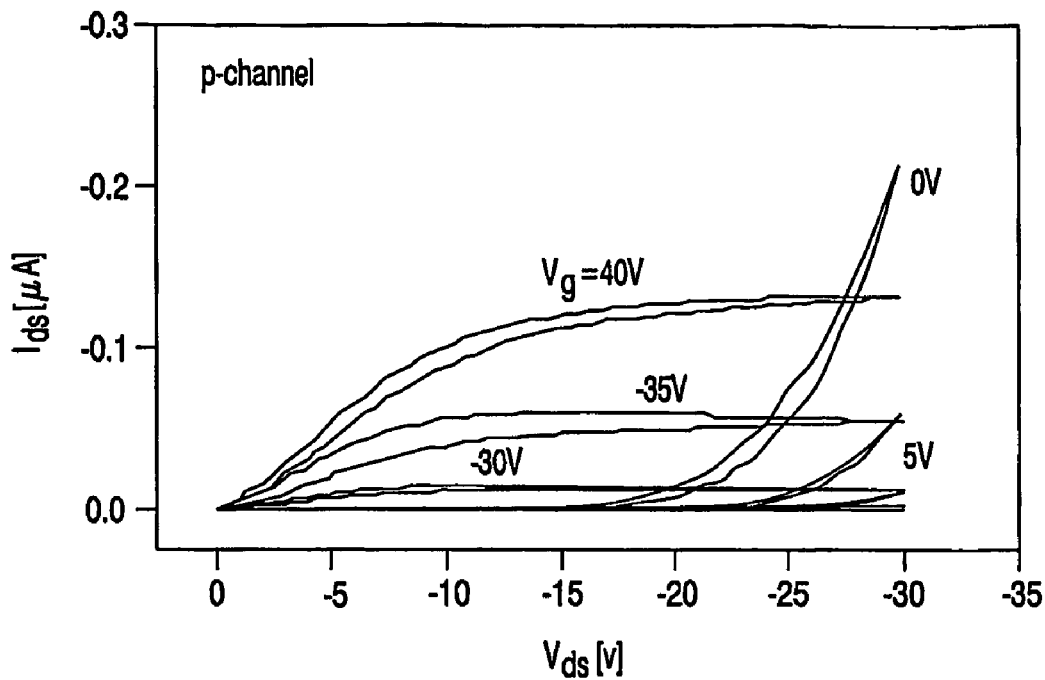
FIG. 7 shows the relationship between the voltage $V_{ds}$ between the source and drain electrode and the resulting current $I_{ds}$ at different voltages $V_g$ on the gate electrode in the ambipolar transistor applied in the invention having as an active layer a single semi-conductor material with a small bandgap.
Figure 7B:
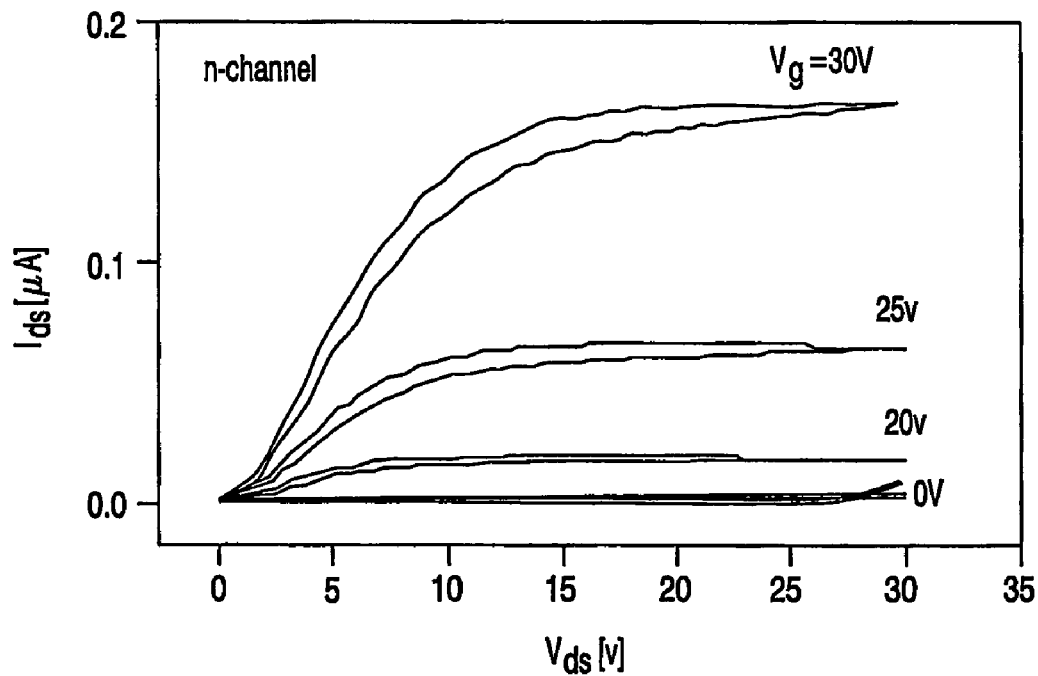

FIG. 7 shows the characteristics of an ambipolar field-effect transistor, in which a material with a small band gap is used as an active layer. In this example use is made, although this is not essential, of poly(3,9-di-tert-butylindeno[1,2-b] fluorene, which is also indicated as PIF. The PIF material was dissolved in chlorobenzene in a concentration of approximately 1%, and applied with the help of spin coating to the surface of test devices. The test devices had the following construction. A gate electrode is located in a silicon substrate. The surface of the substrate is oxidized to silicon dioxide, which forms the dielectric layer. The source and drain electrodes of Au are present on this dielectric layer. On top of this the active layer is present. The channel length was then 40 μm and the channel width 1 mm. The $SiO_2$ layer was treated with a primer, which was hexamethyldisilazane (HMDS). After the spin coating the devices were heated to 90° C. in vacuum. The graphs show that we are dealing here with an ambipolar transistor. The mobility obtained is approximately $2.10^{-5}$ for holes and for electrodes.

Figure 8:
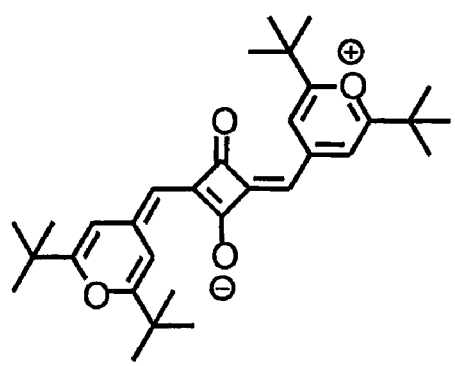
FIG. 8 shows a number of structural formula of organic semiconductor materials with a small bandgap.
Figure 8:
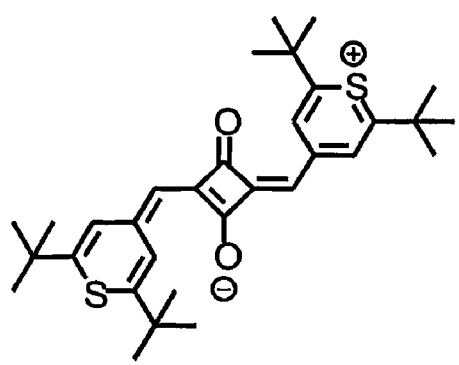
Figure 8:
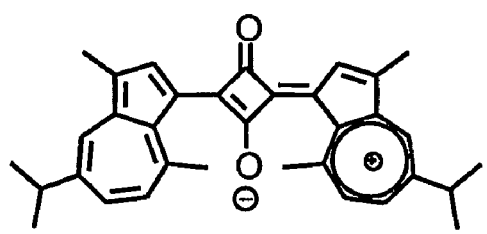
Figure 8:
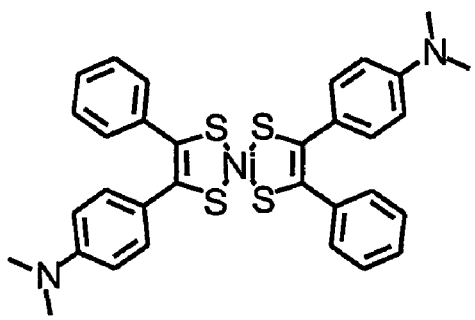
Figure 8:
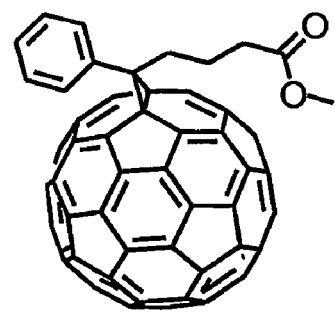

FIG. 8 shows the structural formula of a number of organic semiconductor materials with a small bandgap. The materials are all small molecules. They may be polymerized, but that is not necessary. Preferably they are polymerized into a network, particularly into a network of an electrically insulating polymer The first three of the shown materials SQ1, SQ2, SQ3 are examples from the class of the squaraines. The middle part in these materials is a four-membered ring with two carboxyl-groups. The end groups are in each case different, but connected to the middle part via a methylene group (—CH═), which forms part of the conjugated system. The shown structures are so-called Zwitter-ions in which the middle part is an electron donor with an effective negative charge and the end groups are electron acceptors with an effective positive charge. The end groups are in this example provided with tert-butyl-subgroups. This is not essential, and the tert-butyl-groups may be replaced by other groups, for instance alkyl or alkoxygroups and in particularly n-alkyl or isopropyl or any other aromatic groups. Further examples of subgroups are known from U.S. Pat. No. 5,728,867 and U.S. Pat. No. 4,673,630 and U.S. Pat. No. 5,071,588.

The official names of the shown compounds are:
SQ1: 1-(2,6-Di-tert-butylpyrane-4-yl-methylene)-3-(2,6-di-tert-butylpyrane-4-ylidenmethyl)-2-oxo-cyclobutane-4-olate;
SQ2: 1-(2,6-Di-tert-butylthiopyrane-4-yl-methylene)-3-(2, 6-di-tert-butylthiopyrane-4-ylidenmethyl)-2-oxo-cy-clobutane-4-olate;
SQ3: 2,4-Di-3-guaiazylenyl-1,3-dihydroxycyclobutenediy-lium dihydroxide bis (inner salt)
TPDNi: Bis(4-dimethylaminodithiobenzyl)nickel;
PCBM: [6,6]-phenyl C61 butyric acid methylester. This is however not a small band gap organic semiconductor material according to the invention.

Figure 9:
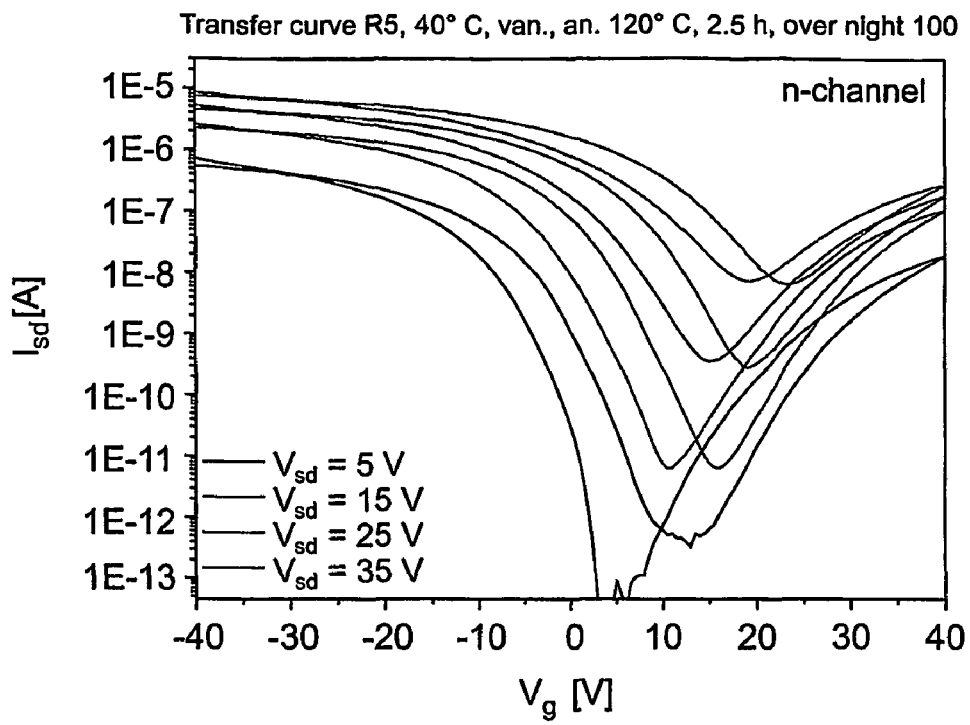
FIG. 9 shows a graph of the relation between the drain current $I_{ds}$ and the voltage applied onto the gate electrode $V_g$ for various positive source-drain voltages $V_{sd}$, which graph is related to compound SQ3 in FIG. 8.
Figure 10:
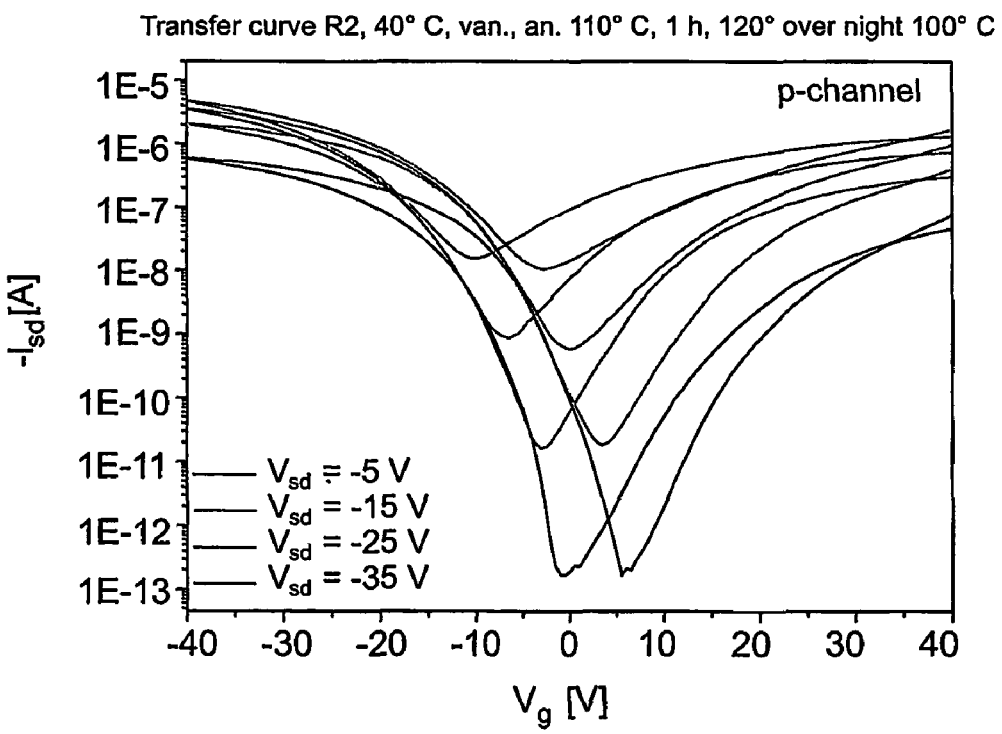
FIG. 10 shows a similar graph as FIG. 9, again for the compound SQ3, but for negative source-drain voltages $V_{sd}$.

FIG. 9 shows a graph of the relation between the drain current $I_{ds}$ and the voltage applied onto the gate electrode $V_g$ for various positive source-drain voltages $V_d$, which graph is related to compound SQ3 in FIG. 8; FIG. 10 shows a similar graph as FIG. 9, again for the compound SQ3, but for negative source-drain voltages $V_d$. These results were obtained by spin coating the materials on a test substrate. The test substrate comprised a highly doped Si $n^{++}$ common gate, and on top of the gate, a layer of $SiO_2$ as gate dielectric, and source and drain electrodes made of gold. The results were measured under vacuum in dark. During the experiments, the source electrode was connected to the ground, and the voltage on the drain electrode was varied so as to set the voltage $V_{sd}$ between source and drain electrode. Each of the figures shows four graphs for different voltages $V_{sd}$.

A left and a right part can be distinguished in FIG. 9. In the left part, the applied gate voltage $V_g$ is negative, and hole transport takes place. In the right part, the applied gate voltage $V_g$ is positive, and electron transport takes place. Comparing this figure to that of FIG. 3, the right part shows behaviour similar to that in a unipolar, n-type transistor. The left part is specific for the ambipolar transistor. For the negative drain voltages $V_{sd}$ as shown in FIG. 10, the same applies, however, here the left part is the hole transport similar to the transport in a conventional unipolar p-type transistor, and the right part is specific for the ambipolar transistor. In other words, the ambipolar transistor can be said to comprise a first channel on the basis of electron transport and a second channel on the basis of holes transport.

As can be derived from these FIGS. 9 and 10, the mobility of the semiconductor material in this transistor is remarkably high. The on/off ratio is very good, and the current in the off status (at $V_g$ near to zero) is very small, particularly for $V_{sd}$ between about −15 and +15 V.

Figure 11:
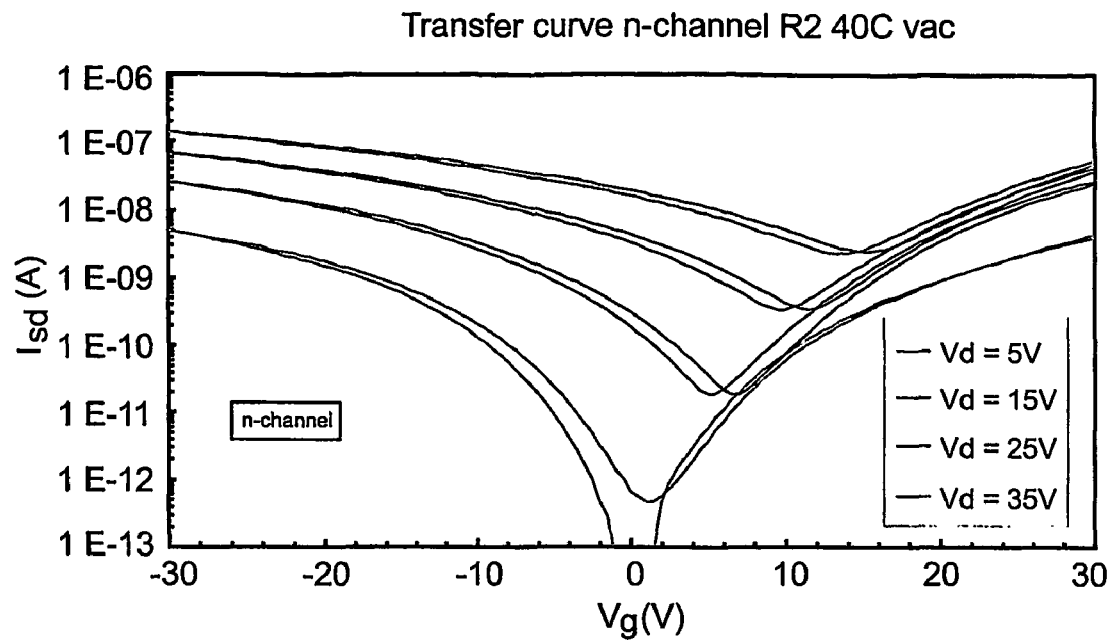
FIG. 11 shows a similar graph as FIG. 9, but now for the compound SQ2 in FIG. 8.
Figure 12:
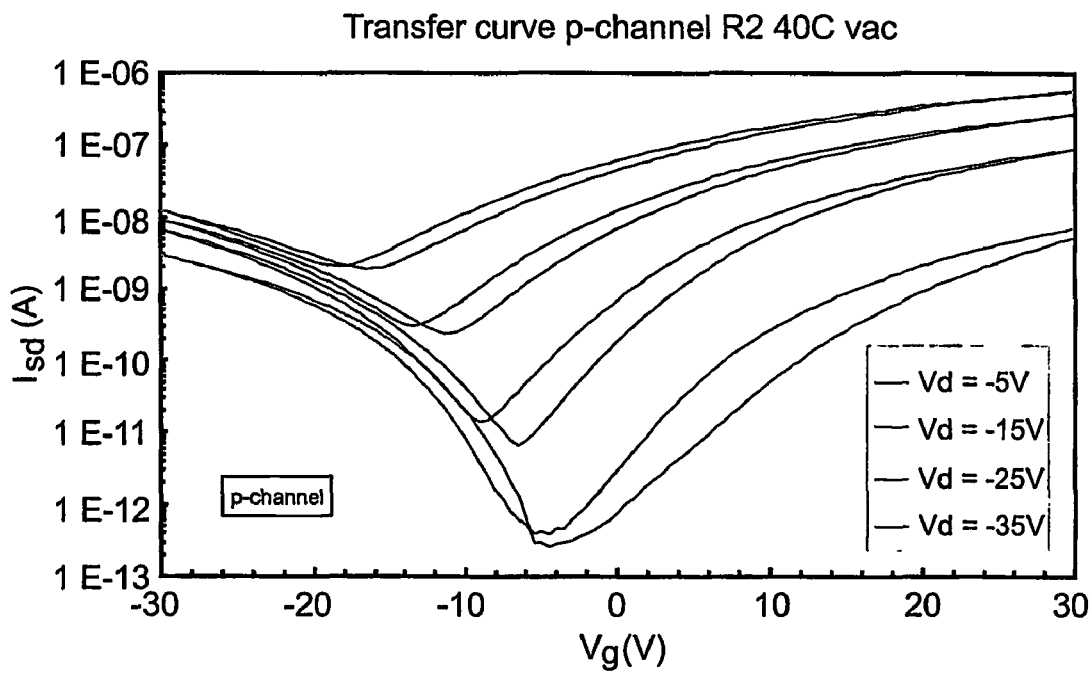
FIG. 12 shows a similar graph as FIG. 11, again for the compound SQ2, but for negative source-drain voltages $V_{sd}$.

FIGS. 11-14 show graphs for other semiconductors materials that also can be used to obtain an ambipolar transistor. FIGS. 11 and 12 show a second example of the group of squaraines, in this case SQ2. This example is found to give a very limited hysteresis, whereas the on/off ratio is smaller than that of SQ3. The current in the off status is comparable to that for SQ2.

Figure 13:
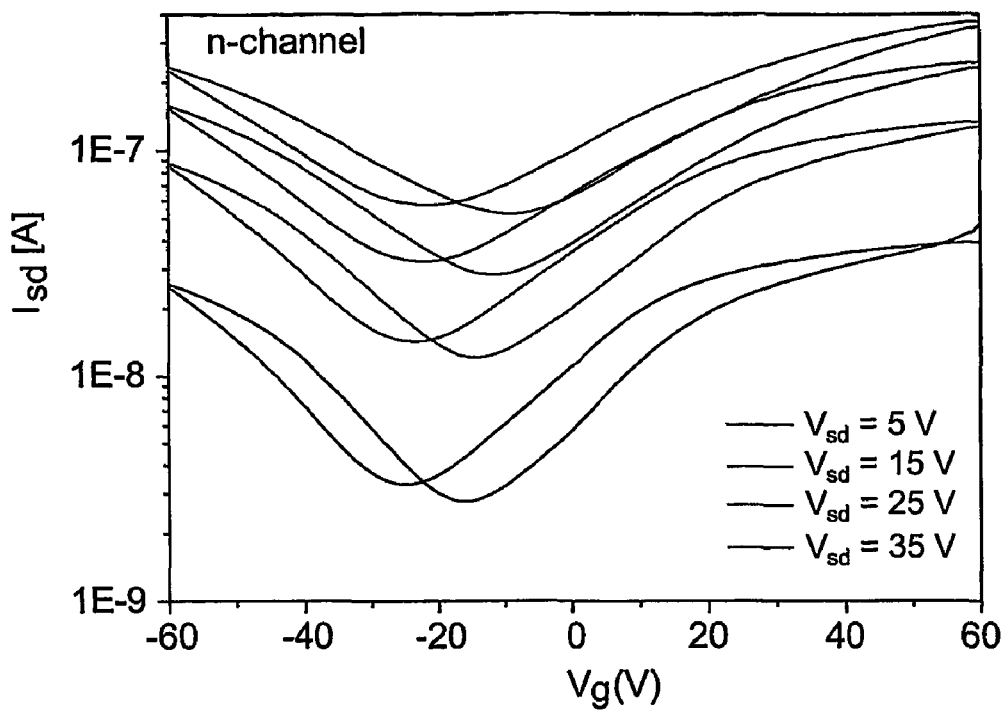
FIG. 13 shows a similar graph as FIG. 9, but now for the compound TPDNi in FIG. 8.
Figure 14:
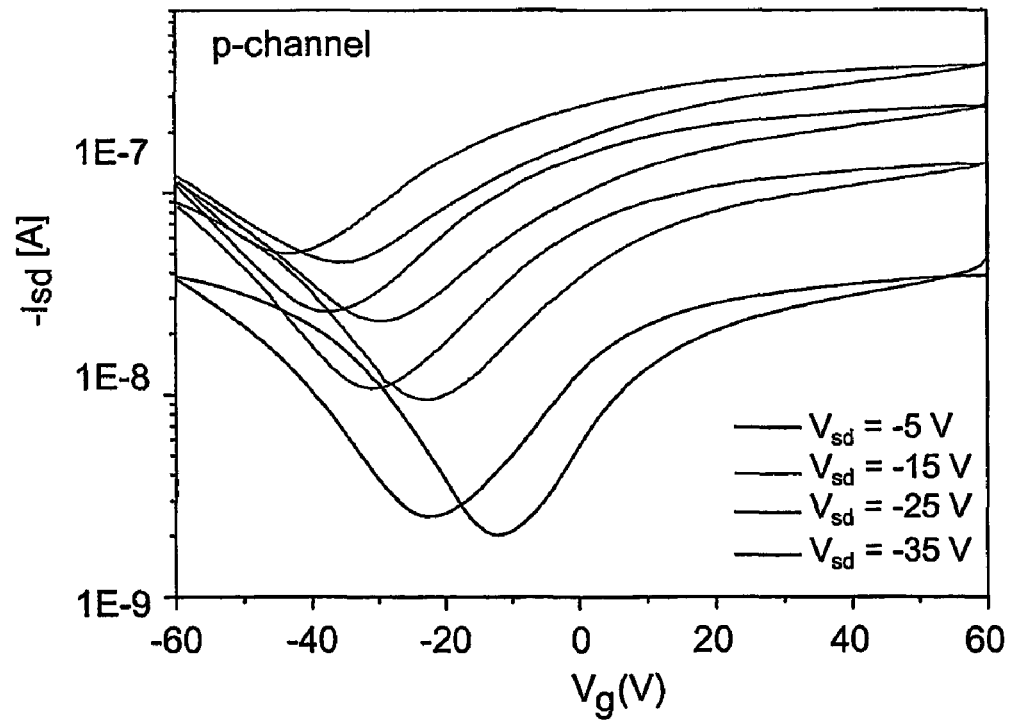
FIG. 14 shows a similar graph as FIG. 13, again for the compound TPDNi, but for negative source-drain voltages $V_{sd}$.

FIGS. 13 and 14 show transfer curves for the tetrathio-nickel complex TPDNi. The properties of this material are less optimal than those of the squaraines. First of all, the on/off ratio is substantially smaller. Secondly, the current in the off status is substantially higher, giving higher leakage currents through the channel In comparison herewith, experiments have been done with pentacene as organic semiconductor material. This is not a small band gap material. Particularly, its band gap is more than 2 eV. Pentacene is well known as a p-type material. The pentacene was applied to the test substrate as a precursor molecule. It was mixed with a carrier material such as known from WO-A 03/030278. After application to the substrate the precursor was converted into pentacene in a heat treatment. Some electron transport was observed in measurements, however, the mobility of the material was close to zero, and the injection barrier between the electrodes and the pentacene is high.

The invention claimed is:

1. An electronic device comprising a field-effect transistor, the field-effect transistor including a source electrode and a drain electrode that are mutually connected by a channel and a gate electrode that is separated from the channel through a dielectric layer, and
   the channel consists of an organic semiconductor material with a small band gap chosen such that the field-effect transistor shows ambipolar behavior, and that the source electrode and drain electrode comprise a same material, and the organic semiconductor material is chosen from the group of the polvindenofluorenes.

2. Electronic device as claimed in claim 1, characterized in that the source electrode and drain electrode are defined as patterns in an electrode layer.

3. Electronic device as claimed in claim 2, characterized in that the electrode layer comprises a noble metal.

4. Electronic device as claimed in claim 2, characterized in that a surface dipolar layer is provided between the electrode layer and the channel.

5. Electronic device as claimed in claim 1, characterized in that the band gap is smaller than 1.8 eV.

6. Electronic device as claimed in claim 1 characterized in that the organic semiconductor material is part of an organic polymer structure said organic polymer structure being obtainable by incorporation of the organic semiconductor material into a matrix material.

7. Electronic device as claimed in claim 6, wherein the organic polymer structure is a polymer network.

8. The electronic device of claim 1 wherein the field effect transistor is integrated in an inverter.

* * * * *